United States Patent
Han

(10) Patent No.: US 6,978,413 B2
(45) Date of Patent: Dec. 20, 2005

(54) METHOD FOR CODING STATUS PDU IN AM RLC ENTITY OF RADIO COMMUNICATION SYSTEM

(75) Inventor: Hyo-Sang Han, Incheon (KR)

(73) Assignee: LG Electronics Inc., Seoul (KR)

( * ) Notice: Subject to any disclaimer, the term of this patent is extended or adjusted under 35 U.S.C. 154(b) by 415 days.

(21) Appl. No.: 10/287,708

(22) Filed: Nov. 5, 2002

(65) Prior Publication Data
US 2003/0093739 A1 May 15, 2003

(30) Foreign Application Priority Data
Nov. 14, 2001 (KR) ............... 2001-70813

(51) Int. Cl.[7] ............... H04L 1/18; H04L 1/14
(52) U.S. Cl. ............... 714/749; 714/750
(58) Field of Search ............... 714/748, 749, 714/750

(56) References Cited

U.S. PATENT DOCUMENTS 6,615,382 B1 * 9/2003 Kang et al. ............... 714/748

OTHER PUBLICATIONS

TSG-RAN Working Group 2 (Radio layer 2 and Radio layer 3) TSGR2#4 (99)385 Berlin May 25th to 28th 1999.*
TSG-RAN Working Group 2 (Radio layer 2 and Radio layer 3) TSGR2#4 (99)405 Berlin, May 25th to 28th 1999.*

* cited by examiner

Primary Examiner—Joseph Torres
(74) Attorney, Agent, or Firm—Fleshner & Kim, LLP

(57) ABSTRACT

A method for encoding a status PDU including receiving AMD PDUs, determining whether or not there are missing AMD PDUs, calculating an error-checking range and at least one error-occurrence range if it is determined that there are missing PDUs, calculating a distance ratio using the error checking range and error occurrence range, determining whether or not the distance ratio is greater than or equal to a threshold value, selecting a type of super-field for constituting a status PDU based on a determination result, encoding the status PDU with the type of selected super-field, and sending the encoded status PDU to a sending party.

15 Claims, 5 Drawing Sheets

FIG.2

| D/C | PDU type | SUFI₁ | | Oct 1 |
|-----|----------|-------|---|-------|
| SUFI₁ | | | | Oct 2 |
| ... | | | | |
| SUFI_K | | | | |
| PAD | | | | Oct N |

FIG.3

| Bit | Description |
|-----|-------------|
| 0 | Control PDU |
| 1 | Data PDU |

FIG.4

| Bit | PDU Type |
|-----|----------|
| 000 | STATUS |
| 001 | RESET |
| 010 | RESET ACK |
| 011-111 | Reserved (PDUs with this coding will be discarded by this version of the protocol). |

FIG.5

| |
|---|
| Type |
| Length |
| Value |

FIG.6

| Bit | Description |
|---|---|
| 0000 | No More Data (NO_MORE) |
| 0001 | Window Size (WINDOW) |
| 0010 | Acknowledgement (ACK) |
| 0011 | List (LIST) |
| 0100 | Bitmap (BITMAP) |
| 0101 | Relative List (Rlist) |
| 0110 | Move Receiving Window (MRW) |
| 0111 | Move Receiving Window Acknowledgement (MRW_ACK) |
| 1000-1111 | Reserved (PDUs with this endcoing are invalid for this version of the protocol) |

FIG.7

| Type = LIST |
|---|
| LENGTH |
| $SN_1$ |
| $L_1$ |
| $SN_2$ |
| $L_2$ |
| ... |
| $SN_{LENGTH}$ |
| $L_{LENGTH}$ |

FIG.8

| Type = RLIST |
|---|
| LENGTH |
| FSN |
| $CW_1$ |
| $CW_2$ |
| ... |
| $CW_{LENGTH}$ |

FIG.9
| Code Word | Description |
|---|---|
| $X_1X_2X_30$ | Next 3 bits of the number are $X_1X_2X_3$ and the number continues in the next CW. The most significant bit within this CW is $X_1$. |
| $X_1X_2X_31$ | Next 3 bits of the number are $X_1X_2X_3$ and the number is terminated. The most significant bit within this CW is $X_1$. This is the most significant CW within the number. |
FIG.10
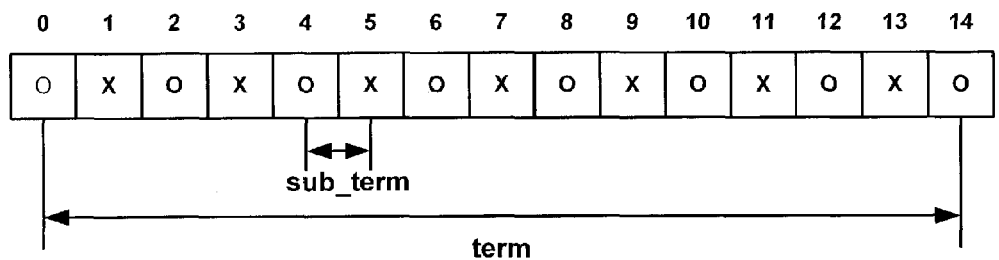
FIG.11
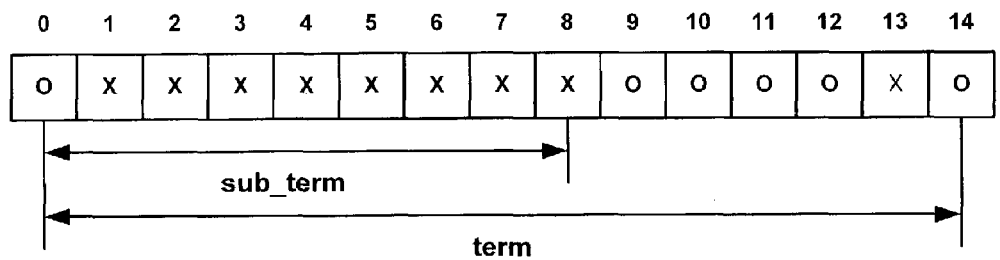

METHOD FOR CODING STATUS PDU IN AM RLC ENTITY OF RADIO COMMUNICATION SYSTEM

BACKGROUND OF THE INVENTION

1. Field of the Invention

The present invention relates to a radio communication system, and in particular to a method for encoding a status PDU in the radio communication system.

2. Background of the Related Art

Radio Link Control (RLC) is a protocol for a user equipment-UMTS Terrestrial Radio Access Network (UE-UTRAN) radio interface in a mobile communication system. The RLC sublayer consists of three RLC entities: a Transparent Mode (TM) entity, an Unacknowledged Mode (UM) entity, and an Acknowledged Mode (AM) entity. Among them, the AM entity exchanges status information using STATUS PDUs to guarantee reliable transmissions. According to this system, a transmitting AM entity retransmits RLC PDUs that are not received by the receiving AM entity.

FIG. 1 shows a model of an AM entity. This entity consists of a transmitting side and a receiving side, where the transmitting side of the AM entity transmits RLC PDUs and the receiving side of the AM entity receives RLC PDUs. The AM RLC acts either as a Sender or as a Receiver depending on the elementary procedure. A sender or a receiver can reside at either the UE or the UTRAN.

In operation, the transmitting side of the AM entity receives RLC SDUs from upper layers through an AM service access point (SAP) 10. RLC SDUs are segmented and/or concatenated into AM data (AMD) PDUs of a fixed length at a segmentation/concatenation unit 20. Segmentation is performed if the received RLC SDU is larger than the length of available space in the AMD PDU. The AMD PDU size is a semi-static value configured by upper layers and can only be changed through reestablishment of the AM RLC entity by upper layers. The AMD PDU may contain segmented and/or concatenated RLC SDUs. The AMD PDU may also contain padding to ensure that it is of a valid size. Length indicators are used to define boundaries between RLC SDUs within AMD PDUs. Length indicators are also used to define whether a Padding or Piggybacked STATUS PDU is included in the AMD PDU.

After segmentation and/or concatenation is performed, the AMD PDUs are placed in the Retransmission buffer 30 and at the MUX 40. AMD PDUs buffered in the Retransmission buffer 30 are deleted or retransmitted based on a status report found within a STATUS PDU or Piggybacked STATUS PDU sent by the peer AM RLC entity. This status report may contain positive or negative acknowledgements of individual AMD PDUs received by the peer AM RLC entity.

The MUX 40 multiplexes AMD PDUs from the Retransmission buffer 30 that need to be retransmitted and the newly generated AMD PDUs delivered from the Segmentation/Concatenation unit 20. They are then temporarily stored the multiplexed AMD PDUs at a transmission buffer 50.

The PDUs are delivered to a unit 60 that completes the AMD PDU header and potentially replaces padding with piggybacked status information. Piggybacked STATUS PDUs can be of variable size in order to match the amount of free space in the AMD PDU. The AMD PDU header is completed based on an input from an RLC Control Unit (80) that indicates the values to set in various fields (e.g. Polling Bit). Unit 60 also multiplexes, if required, Control PDUs received from the RLC Control Unit (RESET and RESET ACK PDUs) and from the Reception buffer (Piggybacked STATUS and STATUS PDUs), with AMD PDUs.

A ciphering unit (if configured) 70 ciphers the AMD PDUs. The AMD PDU header is not ciphered. Piggybacked STATUS PDU and Padding in AMD PDU (when present) are ciphered. Control PDUs (i.e. STATUS PDU, RESET PDU, and RESET ACK PDU) are not ciphered. The transmitting side of the AM entity submits AMD PDUs to the lower layer through one or two dedicated control channel(s) (DCCH) or dedicated traffic channel(s) (DTCH).

The receiving side of the AM entity receives AMD and Control PDUs through the configured logical channels from the lower layer. The AMD PDUs are then routed to the Deciphering Unit 100 by a demux/routing unit 90, where AMD PDUs (minus the AMD PDU header) are deciphered (if ciphering is configured and started) and delivered to the Reception buffer 110.

The AMD PDUs are replaced in the Reception buffer (110) until a complete RLC SDU has been received. The Receiver acknowledges successful reception, or requests retransmission of the missing AMD PDUs by sending one or more STATUS PDUs to the AM RLC peer entity, through its transmitting side. If a Piggybacked STATUS PDUs is formed in an AMD PDU, it is delivered to the Retransmission buffer & Management Unit 30 at the transmitting side of the AM entity after unit 120 removes the RLC header and extracts Piggybacked information, in order to purge the buffer of positively acknowledged AMD PDUs and to indicate which AMD PDUs need to be retransmitted. Once a complete RLC SDU has been received, the associated AMD PDUs are reassembled by the Reassembly Unit 130 and delivered to upper layers through the AM SAP 10.

In addition, RESET and RESET ACK PDUs are delivered to the RLC Control Unit 80 for processing. If a response to the peer AM RLC entity is need, an appropriate Control PDU is delivered by the RLC Control Unit 80 to the transmitting side of the AM RLC entity. The received STATUS PDUs are delivered to the Retransmission buffer and Management Unit 30 at the transmitting side of the AM entity, in order to purge the buffer of positively acknowledged AMD PDUs and to indicate which AMD PDUs need to be retransmitted.

The AM entity can use AM data (AMD) PDU and control PDUs. Among the control PDUs, STATUS PDU and Piggybacked STATUS PDUs are used by the Receiver to inform the Sender about missing and received AMD PDUs in the Receiver, and a size of the allowed transmission window. The STATUS PDU and Piggybacked STATUS PDUs are also used by the Sender to request the receiver to move the reception window and to send an acknowledgment to the Sender about reception of the request to move the reception window.

FIG. 2 shows a STATUS PDU format which is used to exchange status information between two AM entities. The STATUS PDU may include super-fields of different types. The size of a STATUS PDU is variable and upper bounded by the maximum RLC PDU size used by the logical channel through which the control PDUs are sent. Padding shall be included to conform to one of the PDU sizes used by the logical channel on which the control PDUs are sent. The length of the STATUS PDU is a multiple of 8 bits. The D/C field of 1 bit length indicates the type of an AM PDU (see FIG. 3) and the PDU type field of 3 bits indicates the control PDU type (see FIG. 4).

FIG. 5 shows a structure of a super-field (SUFI) which includes three sub-fields: type, length, and value. The length field provides variable length information, the type field has a length of 4 bits, and the value field indicates various information about the STATUS PDU (see FIG. 6).

As shown in FIG. 7, the List super-field consists of a type-identifier field (LIST), a list length field (LENGTH), and a list of LENGTH number of pairs. The four-bit LENGTH field is the number of ($SN_i$, $L_i$)-pairs in the super-field of type LIST. The value "0000" is invalid and the STATUS PDU is discarded. The 12-bit $SN_i$ is "Sequence Number" of AMD PDU, which was not correctly received and 4-bit $L_i$ is number of consecutive AMD PDUs not correctly received following AMD PDU with "Sequence Number" $SN_i$.

As shown in FIG. 8, the Relative List super-field consists of a type identifier field (RLIST), a list length field (LENGTH), the first sequence number (FSN), and a list of LENGTH number of codewords (CW). The 4-bit LENGTH field is the number of codewords (CW) in the super-field of type RLIST. The 12-bit FSN field is the "Sequence Number" for the first erroneous AMD PDU in the RLIST, i.e. LENGTH="0000" means that only FSN is present in the SUFI. The CW consists of 4 bits, where the three first bits are part of a number and the last bit is a status indicator having a value interpreted as in FIG. 9.

By default, the number given by the CWs represents a distance between the previous indicated erroneous AMD PDU up to and including the next erroneous AMD PDU. One special value of CW "0001" is defined as the "Error burst indicator," which means that the next CWs will represent the number of subsequent erroneous AMD PDUs (not counting the already indicated error position). After the number of errors in a burst is terminated with XXX1, the next codeword will again by default be the least significant bits (LSB) of the distance to the next error.

The 3GPP standard TS 25.322 normatively defines errors and the handling of errors. A STATUS PDU or Piggybacked Status PDU including Erroneous Sequence Number is a STATUS PDU or Piggybacked Status PDU that contains a LIST, BITMAP, or RLIST SUFI. Which SUFI fields to use is implementation dependent. Bitmap SUFI is used to indicate both received and/or missing AMD PDUs. List SUFI and/or Relative List SUFI are used to indicate missing AMD PDUs only.

Encoding methods of the List and Relative List SUFIs for indicating missing AMD PDUs have respective advantages and disadvantages.

The Relative List SUFI encoding is superior to the List SUFI encoding in encoding efficiency (number of bytes/information), but it is complex because of the large number of calculations required and is not intuitive. On the other hand, the List SUFI encoding is intuitive and easy to implement because it requires relatively fewer calculations, but its encoding efficiency is less than that of the Relative List SUFI encoding.

In spite of these differences, the 3GPP standard does not specify which SUFI is used for reporting specific erroneous status, i.e., occurrence pattern of the missing AMD PDUs. Accordingly, the receiver randomly selects one of the SUFI types and encodes the SUFI with the selected encoding method for the STATUS PDU to be sent to the sender, and the sender decodes the SUFI of the received STATUS PDUs based on type sub-field of the SUFI.

In this conventional status report method, the SUFI type for indicating the missing AMD PDUs is randomly selected among the three super-field types, such that a reasonable method for selecting error occurrence pattern-adaptive SUFI type is required.

SUMMARY OF THE INVENTION

An object of the invention is to solve at least the above problems and/or disadvantages and to provide at least the advantages described hereinafter.

It is an object of the present invention to provide a method for encoding a super-field of a status PDU according to missing PDU occurrence patterns in the receiver.

To achieve these and other objects, the present invention provides a method for encoding a status PDU which includes receiving AMD PDUs, determining whether or not there are missing AMD PDUs, calculating an error checking range and at least one error occurrence range if it is determined that there are missing PDUs, calculating a distance ratio using the error checking range and error occurrence range, selecting a type of super-field for constituting a status PDU based on a calculation result, encoding the status PDU with the selected super-field, and sending the encoded status PDU to a sending party. The method further comprises sending a status PDU for reporting successful reception if it is determined that there is no missing PDU.

In the method, the error-checking range may be defined as a distance between a sequence number of a PDU successfully received right before a first error PDU to be coded and a sequence number of a successfully received PDU to be lastly coded, and the error-occurrence range may be defined as a distance between a sequence number of a successfully received PDU and a highest one among the sequence numbers of consecutively occurred error PDUs right after the successfully received PDU. The distance ratio may be calculated by a following equation:

$$R = \Sigma \text{sub\_term}/\text{term}$$

where R is the distance ratio, sub_term is the error-occurrence range, and term is the error checking range.

The super-field type selection step comprises the sub-steps of determining whether or not the distance ratio is greater than or equal to a threshold value, selecting an LIST super-field coding if the distance ratio is greater than or equal to the threshold value, and selecting an RLIST super-field coding if the distance ratio is less than the threshold value.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIG. 2 shows a status PDU format used to exchange status information between two RLC AM entities of FIG. 1;

FIG. 3 is a table for explaining values of a D/C field of the status PDU of FIG. 2;

FIG. 4 is a table for explaining values of a PUD type field of the status PDU of FIG. 2;

FIG. 5 shows a structure of a super-field of the status PDU of FIG. 2;

FIG. 6 is a table for explaining values of a type sub-field of the super-field of FIG. 5;

FIG. 7 shows a structure of a list super-field of FIG. 6;

FIG. 8 shows a structure of a relative list super-field of FIG. 6;

FIG. 9 is a table for explaining values of a codeword sub-field of the relative list super-field of FIG. 8;

FIG. 10 is a drawing for illustrating a blue noise type error occurrence pattern;

FIG. 11 is a drawing for illustrating white noise type error occurrence pattern.

DETAILED DESCRIPTION OF PREFERRED EMBODIMENTS

Figure 1:
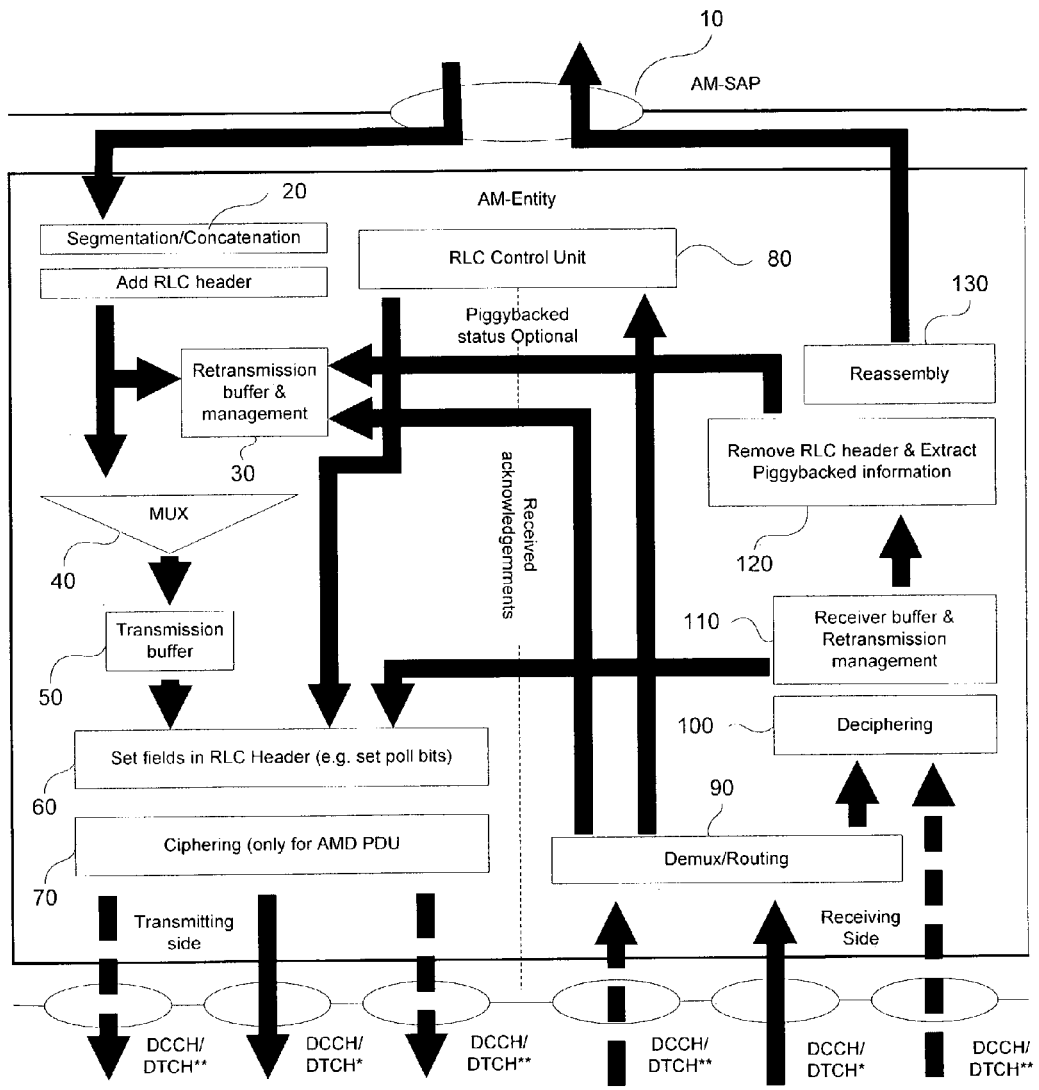
FIG. 1 is a conceptual view for illustrating an operation of an acknowledged mode RLC entity model according to the 3GPP TS 25.322.

A preferred embodiment of the present invention will be described hereinafter with reference to the accompanying drawings.

If an AM RLC entity of a sender receives RLC SDUs from upper layers through an AM SAP, the RLC SDUs are segmented and/or concatenated into AMD PDUs of a fixed length. The AMD PDUs are transmitted to a peer AM RLC entity of a receiver. The AM RLC entity of the receiver receives and places the AMD PDUs in a reception buffer until a complete RLC SDU has been received. Once a complete RLC SDU has been received, the associated AMD PDUs are reassembled and delivered to upper layers through the AM SAP.

If there are missing AMD PDUs, the receiver requests retransmission of the missing AMD PDUs by sending one or more STATUS PDUs to the AM RLC entity of the sender, so that the AM entity of the sender retransmits the missing AMD PDUs.

The 3GPP standard specifies the LIST, BITMAP, and RLIST super-fields, which are contained only in the status PDUs, for indicating missing AMD PDUs.

While two AM RLC entities communicate, AMD PDU transmission errors can occur in various patterns.

In the status PDU coding method of the present invention, when AMD PDUs are missing, the AM entity of the receiver analyzes the error occurrence pattern and determines which super field is used for indicating the missing PDUs to be retransmitted based on the error occurrence pattern.

The error occurrence pattern is classified into two types according to the present invention: blue and white noise types. In the present invention, a distance between a sequence number of a PDU successfully received right before a first error PDU to be coded and a sequence number of a successfully received PDU to be lastly coded is defined by an error-checking range "term," and a distance between a sequence number of a successfully received PDU and a highest one among the sequence numbers of consecutively occurred error PDUs right after the successfully received PDU is defined by an error occurrence range "sub_term".

FIG. 10 shows an example of a blue-noise-(caused by high frequency) type error-occurrence pattern. As shown, the successfully received AMD PDUs "0" and erroneous AMD PDUs "X" alternately appear and the SUB_TERM is short. In blue-noise-(caused by high frequency) type errors, the errors occur relatively in a complex pattern such that information to be reported to the sender increases. When the errors occur in the blue-noise-type, the AM entity of the receiver encodes an RLIST super-field in the status PDU.

FIG. 11 shows an example of white-noise-(caused by low frequency) type error-occurrence pattern. As shown, the missing PDUs "X" continuously occur and the SUB_TERM is long. In white-noise-type errors, the errors occur in a simple pattern such that a relatively small quantity of information is reported to the sender. When the errors occur in white-noise-type, the AM entity of the receiver encodes a LIST super-field in the status PDU.

Whether the error occurrence pattern is blue-noise-type or white-noise-type is determined by a distance ratio (R) obtained by the following equation 1.

Distance Ratio $(R)=\Sigma sub\_term/term$ (1)

In Equation 1, recall that the sub-term may be defined as a distance between a sequence number of a successfully received PDU and a highest one among the sequence numbers of consecutively occurred error PDUs right after the successfully received PDU. If a value of the distance ratio (R) is greater than or equal to a threshold value (T), it is determined that the errors occur in a white-noise-type error occurrence pattern. On the other hand, if the value of the distance ratio (R) is less than the threshold value (T), it is determined that the errors occur in a blue-noise-type error-occurrence pattern.

The threshold value (T) may be a value between 0 and 1 and can be adjusted for defining a super field utilization tendency. That is, the RLIST super-field is frequently selected for the status report format as the threshold value (T) approaches 1, but the LIST super-field is frequently selected for the status report format as the threshold value m approaches 0. The threshold value (T) can be set system-adaptively so as to be adjusted appropriately for the system characteristics.

To illustrate the foregoing aspects of the invention, R is calculated as follows for FIG. 10. In this figure, term=14−0=14, the sum of the sub_terms=(1−0)+(3−2)+(5−4)+(7−6)+(9−8)+(11−10)+(13−12)=7. Given these values, R= 7/14 using Equation (1). In FIG. 11, the term is also 14−0=14 but the sub_term=(8−0)+(13−12)=9. Given these values, R= 9/14 using Equation (1).

Figure 12:
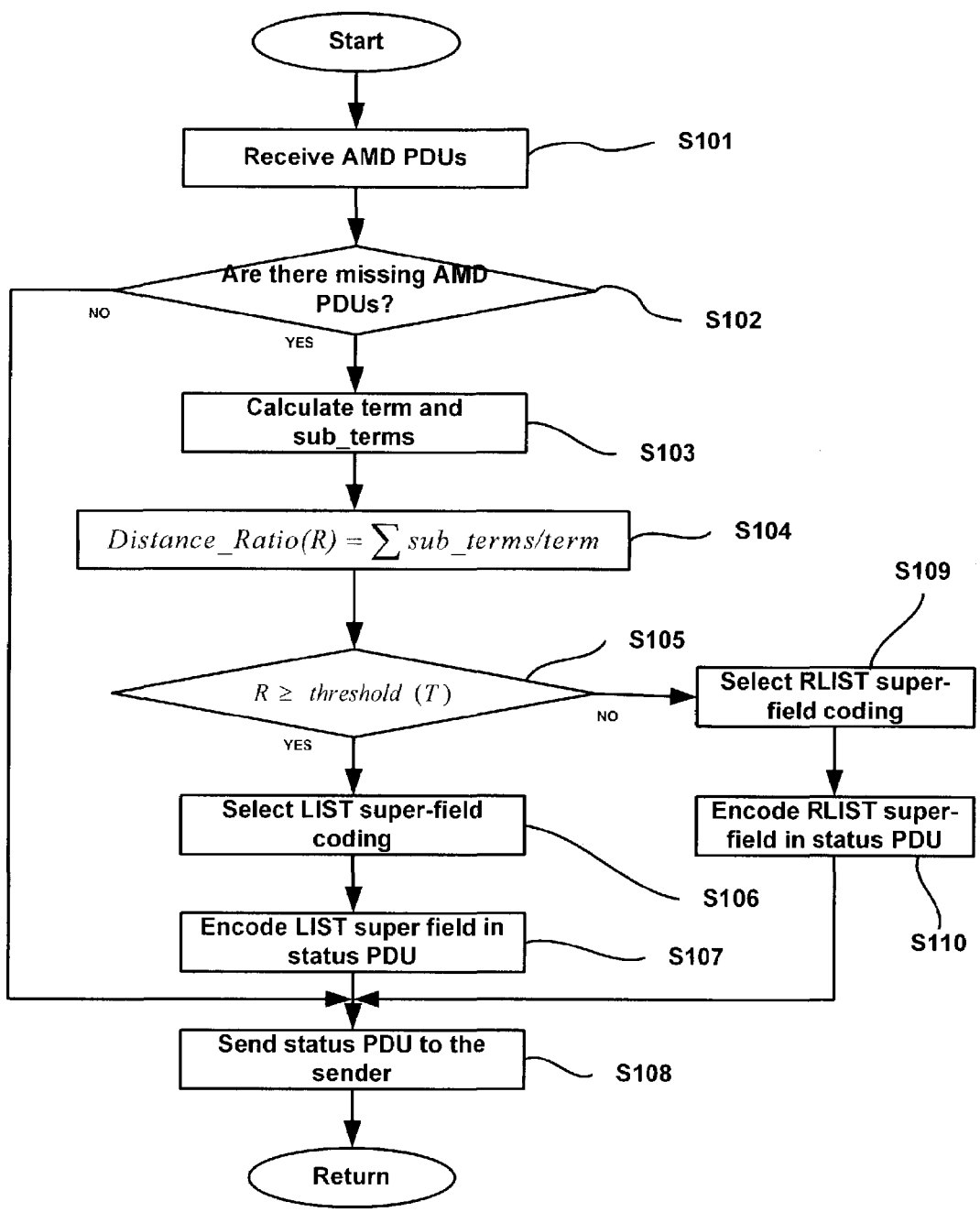
FIG. 12 is a flowchart illustrating a method for coding status PDUs according to a preferred embodiment of the present invention.

FIG. 12 is a flowchart illustrating the status PDU encoding method according to a preferred embodiment of the present invention. In an initial step of the method, once the AMD PDUs consisting of a RLC SDU are received and placed in a reception buffer at step S101, the AM entity of the receiver detects at least one missing PDU at step S102.

If there are no missing PDUs, the AM entity acknowledges successful reception to a peer AM entity of a sender at step S108. Otherwise, if there are missing PDUs, the AM entity calculates term and sub_term at step S103, and then calculates the distance ratio (R) based on the calculated term and the sub_term at step S104.

Next, the AM entity determine if a distance ratio (R) is greater than the threshold value (T) at step S105. If R is greater than or equal to T at step S105, the AM entity selects the LIST super-field encoding at step S106, encodes an LIST super-field in a status PDU at step S107, and send the status PDU to the sender at step S108.

On the other hand, if R is less than T at step S105, the AM entity selects the RLIST super-field encoding at step S109, encodes an RLIST super-field in a status PDU at step S110, and send the status PDU to the sender at step S108.

In the method for encoding the status PDU according to the present invention, as described above, the super-field constituting a status PDU is selectively encoded in the LIST or RLIST type depending on the error occurrence pattern, i.e., blue or white noise type error occurrence pattern, such that the method improves a system performance in traffic adaptive manner.

Also, in the method the threshold value (T) which is a standard to select a super-field type can be manually changed such that the super-field type selection tendency can be adjusted, resulting in improvement of the RLC protocol performance.

The foregoing embodiments and advantages are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. For example, the word "sub-term" may alternative be construed to correspond to any of the following: a term, the number of sub-terms in a term, an average of the sub-terms in a term.

What is claimed is:

1. A method for encoding a status PDU, comprising:
   (a) receiving AMD PDUs;
   (b) determining whether at least one AMD PDU is missing;
   (c) calculating an error-checking range (term) and at least one error-occurrence range (sub_term), if it is determined that there is said at least one AMD PDU missing at step (b);
   (d) calculating a distance ratio based on the error-checking range (term) and the at least one error-occurrence range (sub-term);
   (e) selecting a type of super-field for constituting a status PDU based on a calculation result at step (d);
   (f) encoding the status PDU with the selected super-field; and
   (g) sending the encoded status PDU to a sender.

2. The method of claim 1, further comprising:
   sending a status PDU for reporting successful reception to the sender if it is determined that there is no missing PDU at step (b).

3. The method of claim 1, wherein the error-checking range is a distance between a sequence number of a PDU successfully received right before a first error PDU to be coded and a sequence number of a successfully received PDU to be lastly coded.

4. The method of claim 1, wherein the error-occurrence range is a distance between a sequence number of a successfully received PDU and a highest one among the sequence numbers of consecutively occurred error PDUs right after the successfully received PDU.

5. The method of claim 1, wherein the distance ratio is calculated by a following equation:

Distance ratio=Σsub_term/term.

6. The method of claim 1, wherein the step (e) comprises:
   determining whether or not the distance ratio is greater than or equal to a predetermined threshold value; and
   selecting a LIST super-field coding if the distance ratio is greater than or equal to the threshold value.

7. The method of claim 6, further comprising:
   selecting an RLIST super-field coding if the distance ratio is less than the threshold value.

8. A method for encoding a status PDU, comprising:
   receiving AMD PDUs;
   determining whether there are missing AMD PDUs;
   calculating an error-checking range (term) and at least one error-occurrence range (sub_term) if it is determined that there are missing PDUs;
   calculating a distance ratio based on the error-checking range (term) and error-occurrence range (sub_term);
   determining whether the distance ratio is greater than or equal to a predetermined threshold value;
   selecting a type of super-field constituting a status PDU based on a determination result;
   encoding the status PDU with the type of selected super-field; and
   sending the encoded status PDU to a sender.

9. The method of claim 8, wherein the type of super-field is LIST if the distance ratio is greater than or equal to the threshold value.

10. The method of claim 8, wherein the type of super-field is RLIST if the distance ratio is less than the threshold value.

11. The method of claim 8, wherein the distance ratio is calculated by a following equation:

$R=\Sigma \text{sub\_term}/\text{term}$ where R is the distance ratio.

12. The method of claim 11, wherein the error-checking range (term) is a distance between a sequence number of a PDU successfully received right before a first error PDU to be coded and a sequence number of a successfully received PDU to be lastly coded.

13. The method of claim 11, wherein the error-occurrence range (sub_term) is a distance between a sequence number of a successfully received PDU and a highest one among the sequence numbers of consecutively occurred error PDUs right after the successfully received PDU.

14. The method of claim 11, wherein the error-occurrence range is a distance equal to a number of consecutively missing PDUs.

15. The method of claim 8, wherein the error-occurrence range is a distance equal to a number of consecutively missing PDUs.

* * * * *